US007091720B2

(12) United States Patent
Heubes

(10) Patent No.: US 7,091,720 B2
(45) Date of Patent: Aug. 15, 2006

(54) MAGNETIC RESONANCE TOMOGRAPHY METHOD AND APPARATUS WITH SUPPRESSION OF AMBIGUITY ARTIFACTS IN SPIN ECHO IMAGES

(75) Inventor: Peter Heubes, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 10 days.

(21) Appl. No.: 10/898,495

(22) Filed: Jul. 23, 2004

(65) Prior Publication Data

US 2005/0017719 A1    Jan. 27, 2005

(30) Foreign Application Priority Data

Jul. 24, 2003    (DE)    ................................ 103 33 795

(51) Int. Cl.
*G01V 3/00*    (2006.01)
(52) U.S. Cl. ...................................... 324/314; 324/309
(58) Field of Classification Search ................ 324/309, 324/307
See application file for complete search history.

(56) References Cited

U.S. PATENT DOCUMENTS

| | | | | |
|---|---|---|---|---|
| 4,952,876 A | * | 8/1990 | Pelc ............................. | 324/309 |
| 4,959,611 A | * | 9/1990 | Brovost et al. .............. | 324/309 |
| 5,386,190 A | * | 1/1995 | Takeuchi et al. ............ | 324/309 |
| 5,530,354 A | * | 6/1996 | Herlihy et al. ............... | 324/318 |
| 6,486,668 B1 | | 11/2002 | Ma | |
| 6,492,810 B1 | * | 12/2002 | Hajnal ......................... | 324/309 |
| 2002/0101237 A1 | | 8/2002 | Miyosi et al. | |

OTHER PUBLICATIONS

"RARE Imaging: A Fast Imaging Method for Clinical MR," Hennig et al., Magnetic Resonance in Medicine, vol. 3, (1986), pp. 823-833.
"Image Acquisition in a Second with Half-Fourier Acquisition Single-Shot Turbo Spin Echo," Kiefer et al., J. Mag. Res. Imaging, vol. 4 (P) (1994), pp. 86-87.

* cited by examiner

*Primary Examiner*—Diego Gutierrez
*Assistant Examiner*—Jeremiah Shipman
(74) *Attorney, Agent, or Firm*—Schiff Hardin LLP

(57) ABSTRACT

In a magnetic resonance tomography method and apparatus for avoiding peripheral interference signals in magnetic resonance tomography when using spin-echo sequences, the average frequency and the bandwidth of the radio-frequency excitation pulse differ from the average frequency and the bandwidth of the radio-frequency refocusing pulse(s), and the amplitude of the slice selection gradients activated during the radio-frequency excitation pulse differing from the amplitude of the slice selection gradient(s) activated during the radio-frequency refocusing pulse, such that the excitation slice of the RF excitation pulse and the refocusing slice of the RF refocusing pulse(s) in the homogeneous volume (FOV) of the basic magnetic field are superimposed, while the excitation slice of the RF refocusing pulse(s) in the non-homogeneous volume of the basic magnetic field are separated locally, and an echo signal is thereby prevented in the non-homogeneous volume.

24 Claims, 11 Drawing Sheets

QUANTIFICATION WITH SIMPLE FIELD MODEL
(SPIN ECHO, GS=GZ, TX)

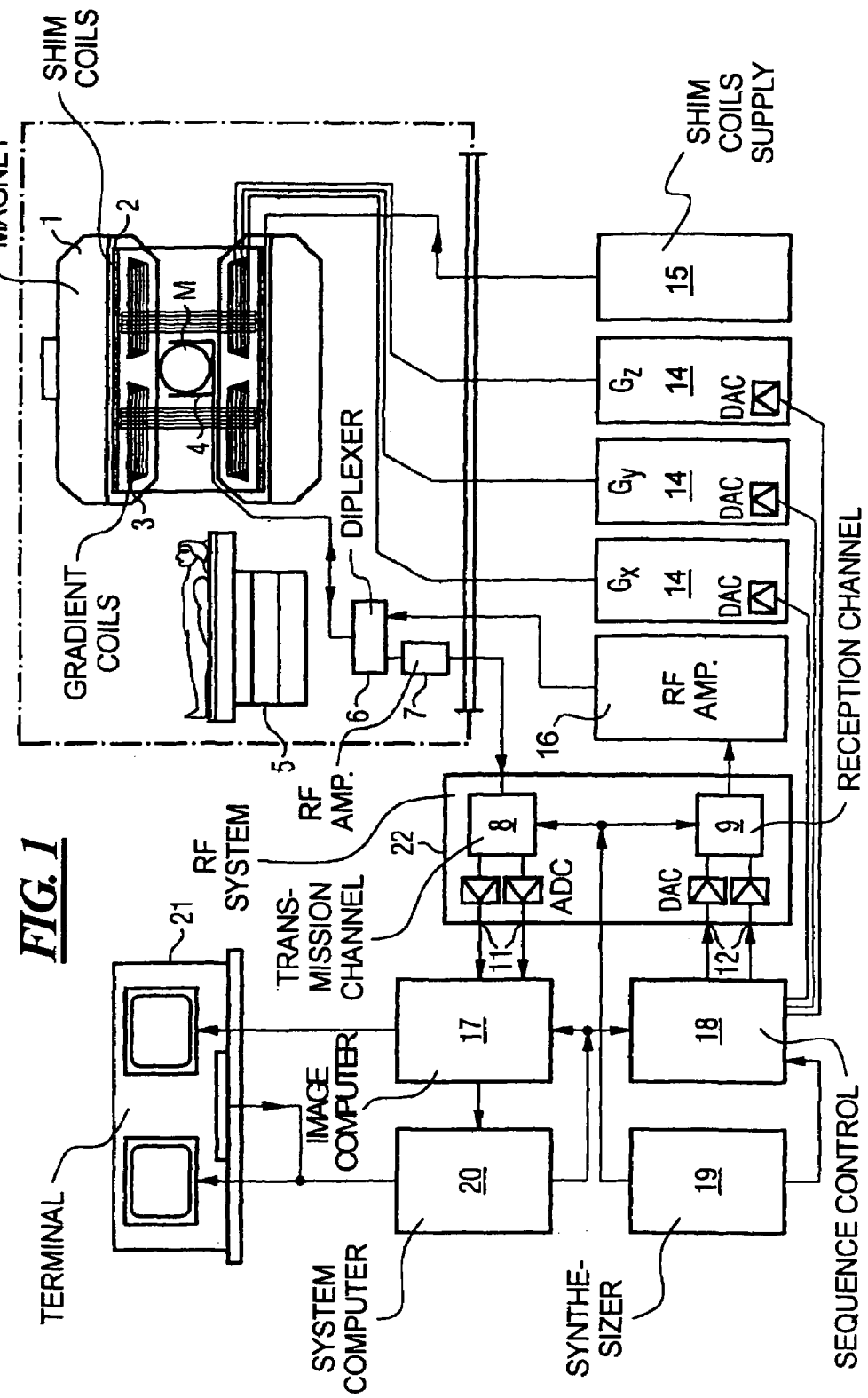

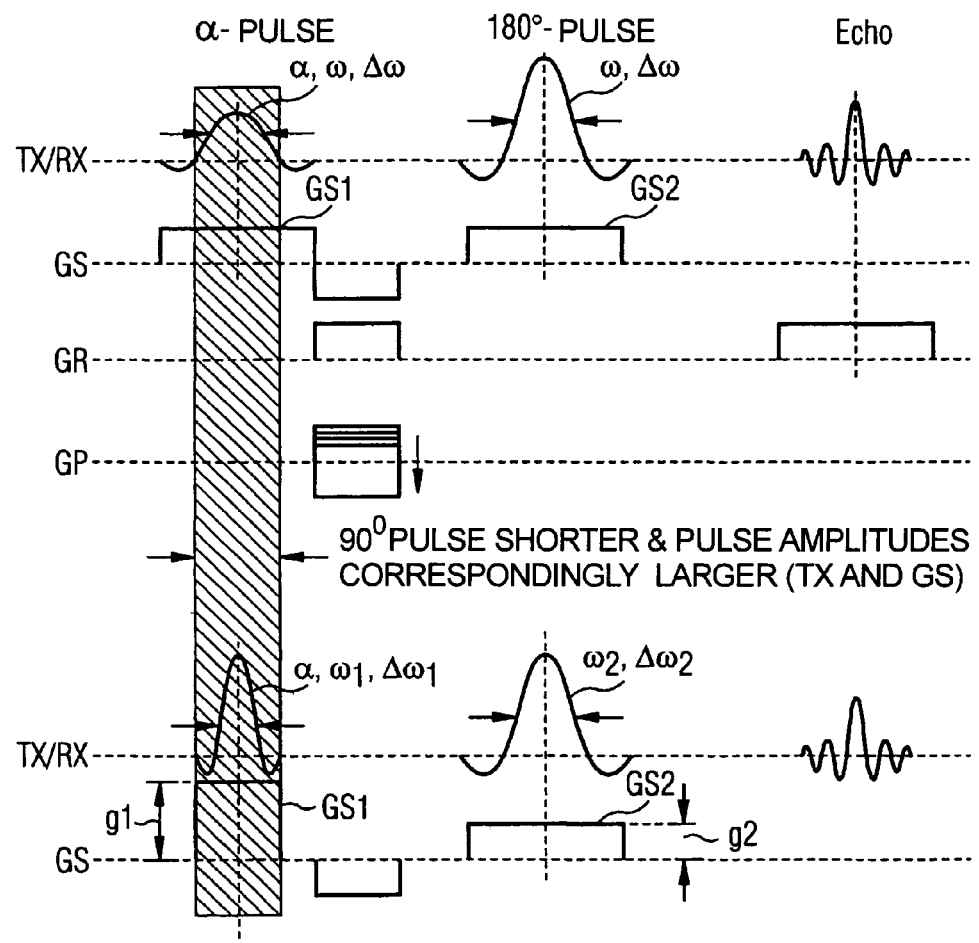

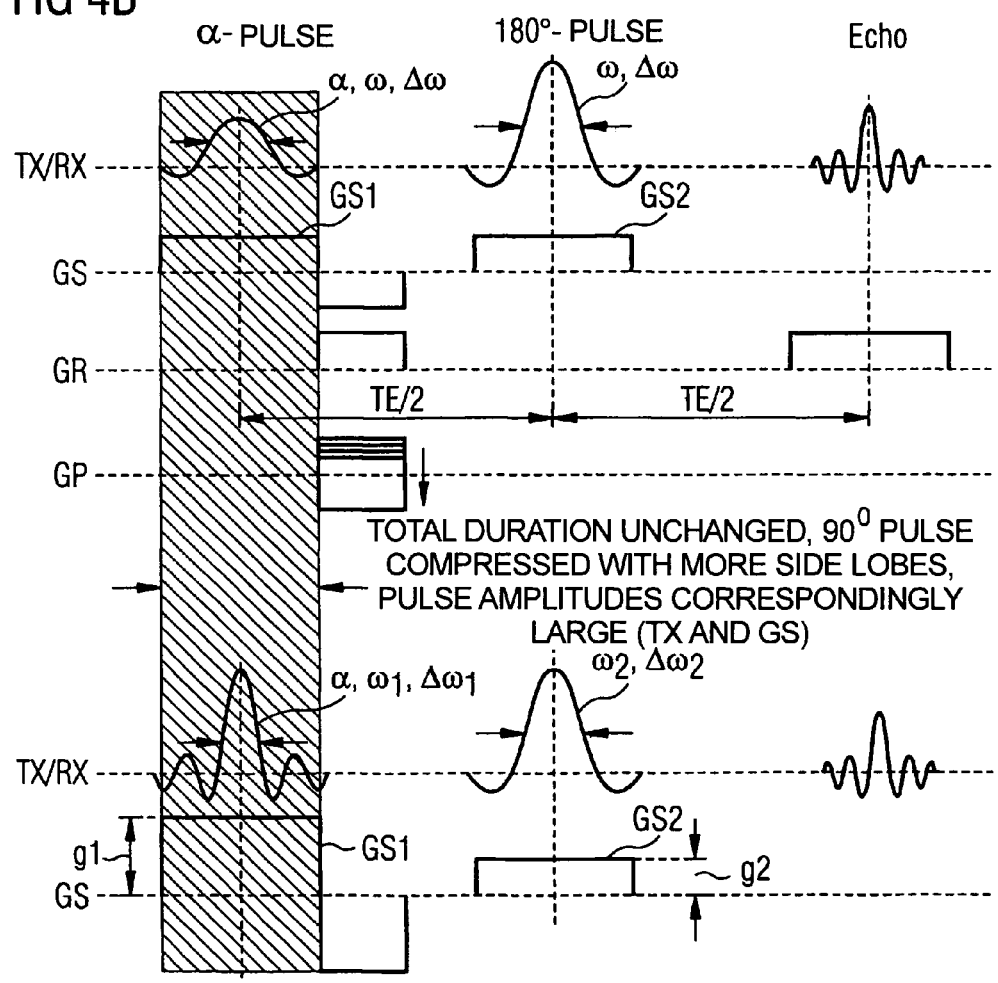

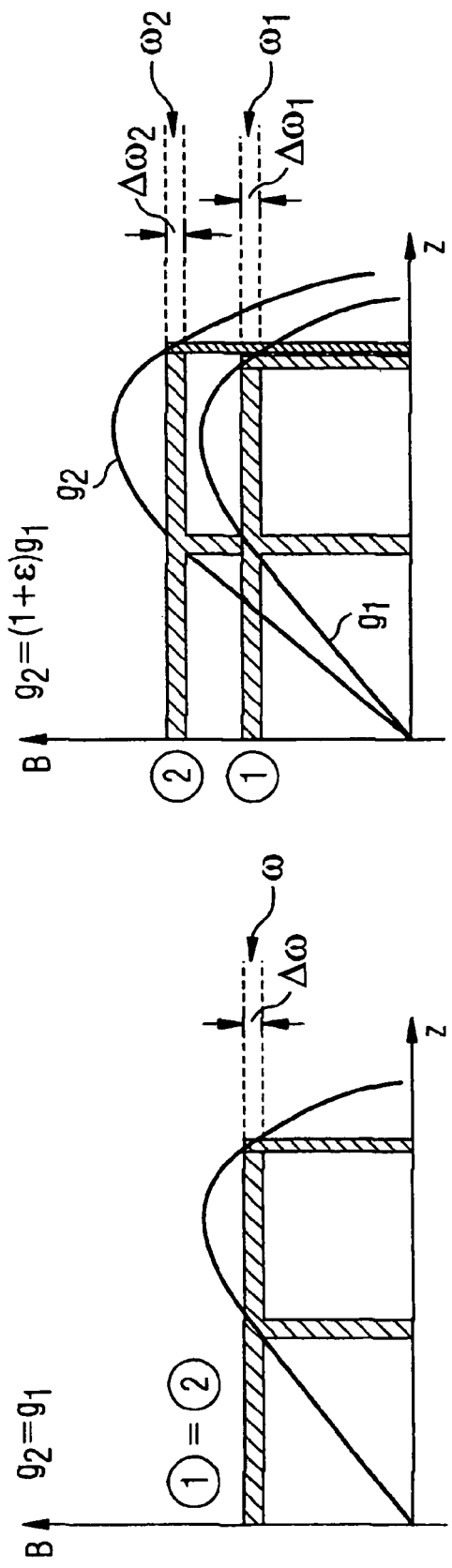
FIG 5A  WITH SEVERAL RF PULSE ①, ② (SPIN ECHO GS=GZ)

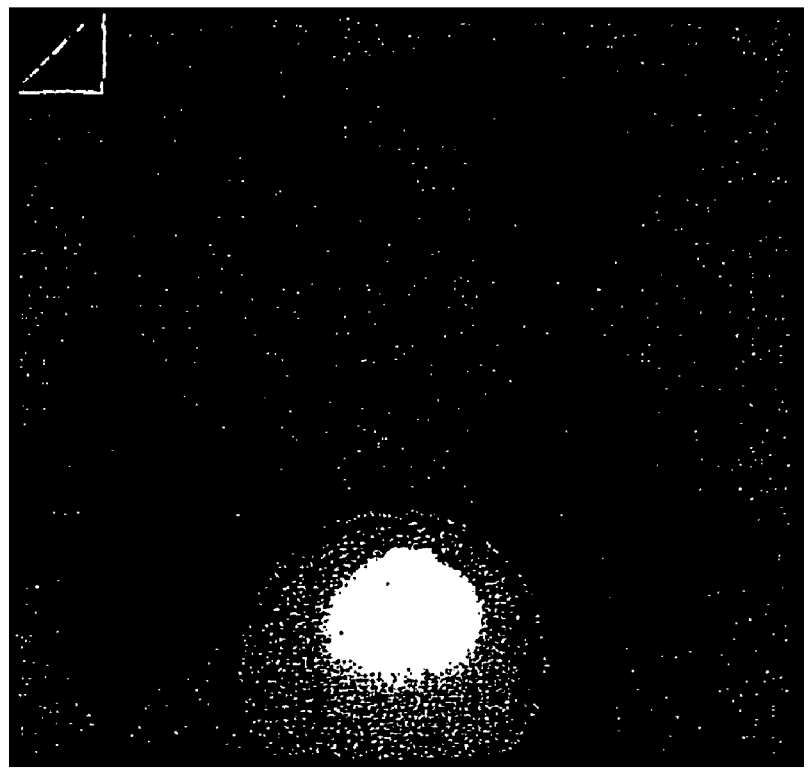
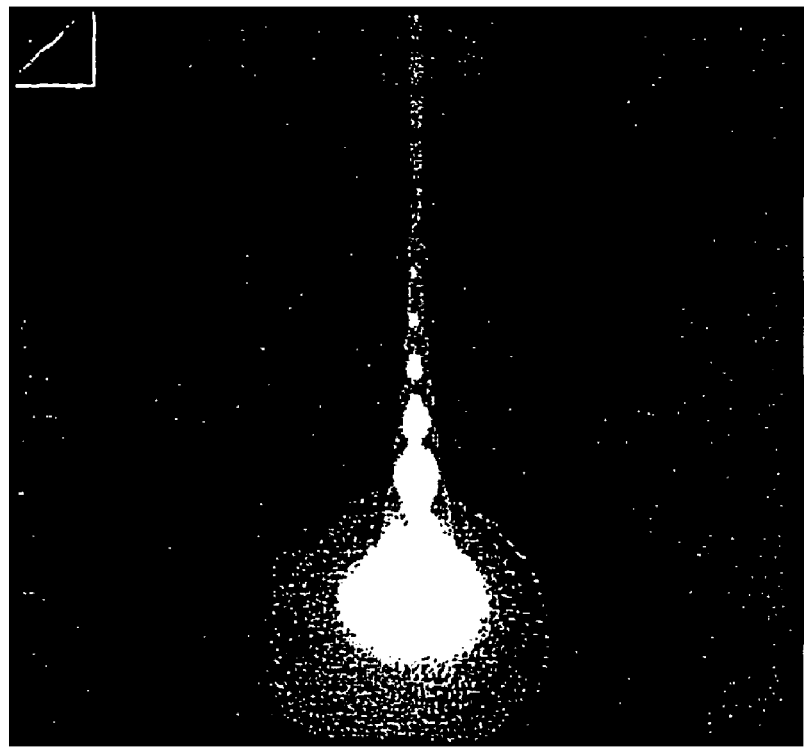
FIG 5B
$g_2 = g_1$
$g_2 = (1+\varepsilon)g_1$

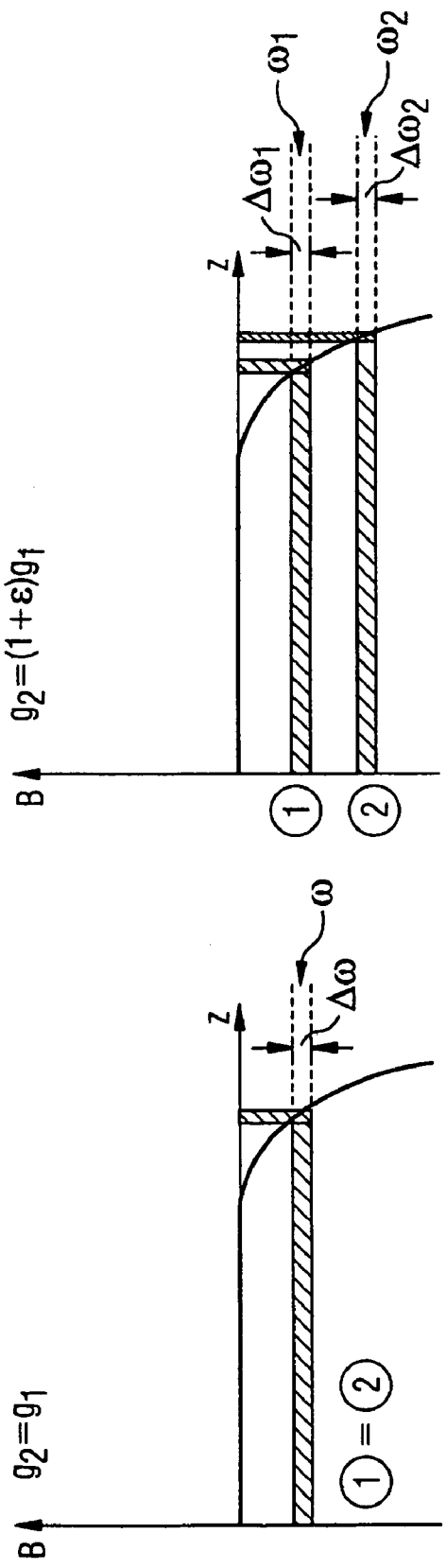

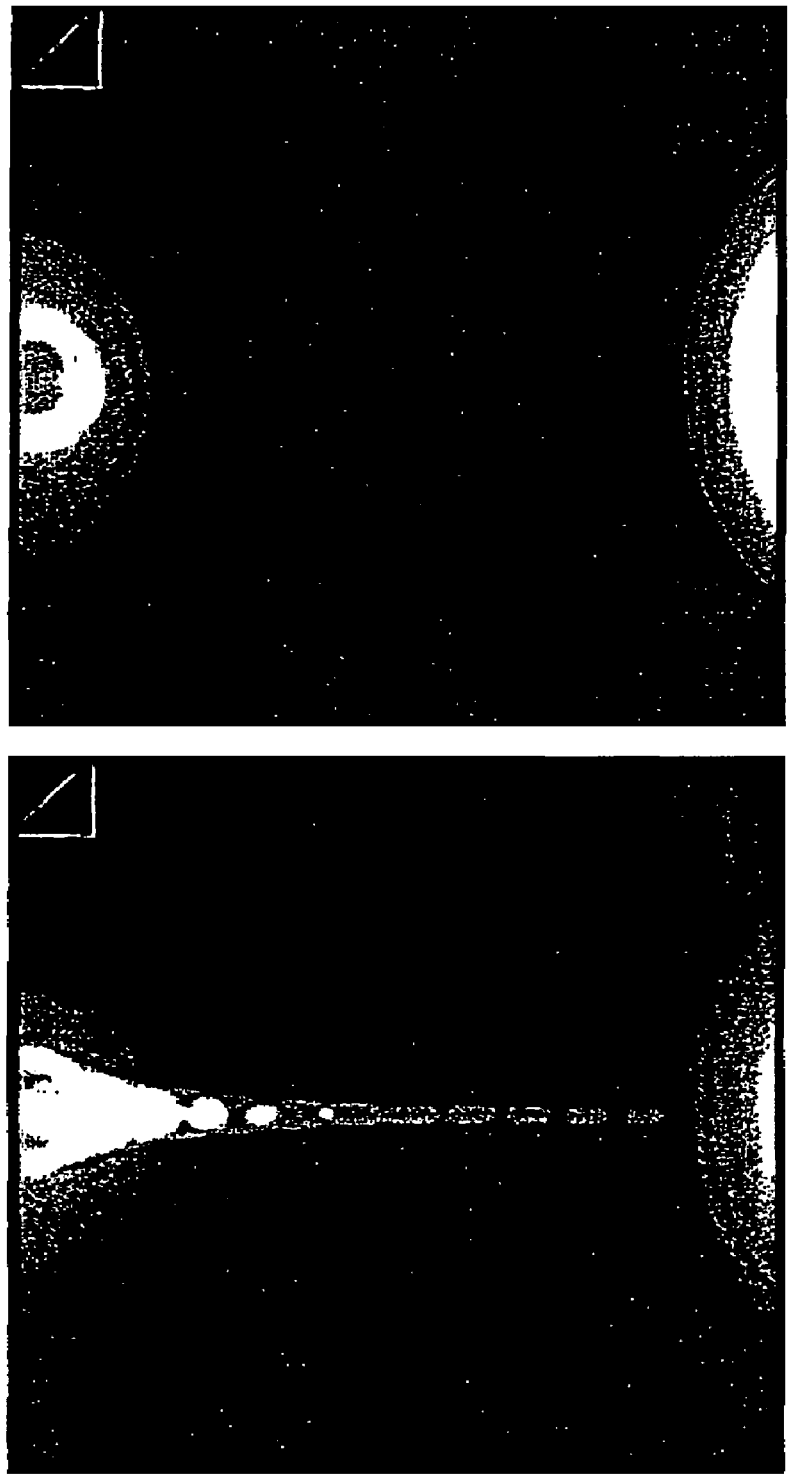

QUANTIFICATION WITH SIMPLE FIELD MODEL
(SPIN ECHO, GS=GZ, TX)

SPIN ECHO, GS=GZ $$\varepsilon = \frac{1}{(R-r)/d - 1/2}$$

FIG 8A  QUANTIFICATION WITH SIMPLE FIELD MODEL
(SPIN ECHO, GS ≠ GZ, TX)
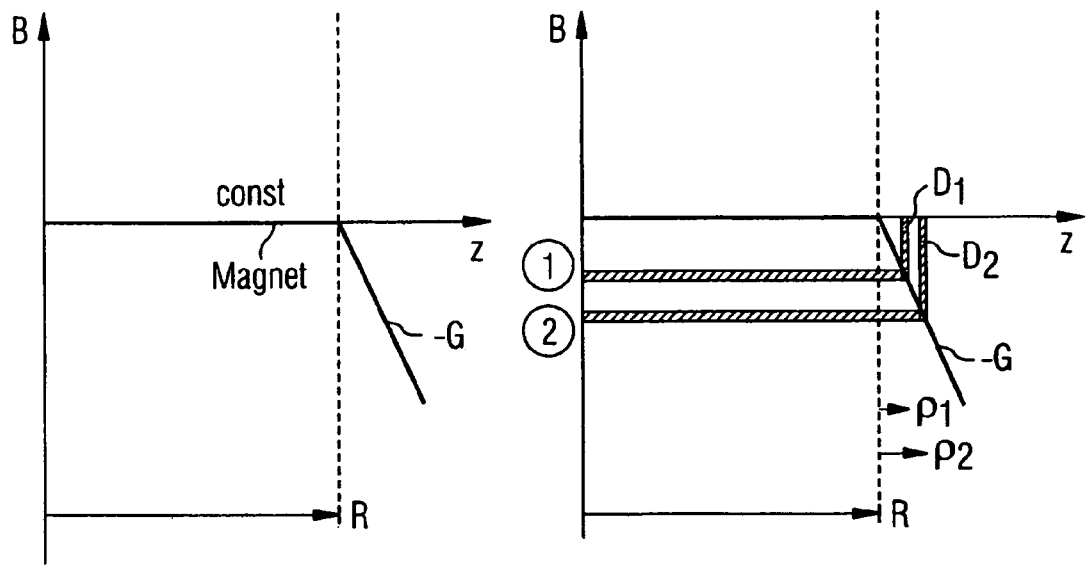
FIG 8B  SPIN ECHO GS ≠ GZ
$$\varepsilon = \frac{1}{-r/d - 1/2}$$
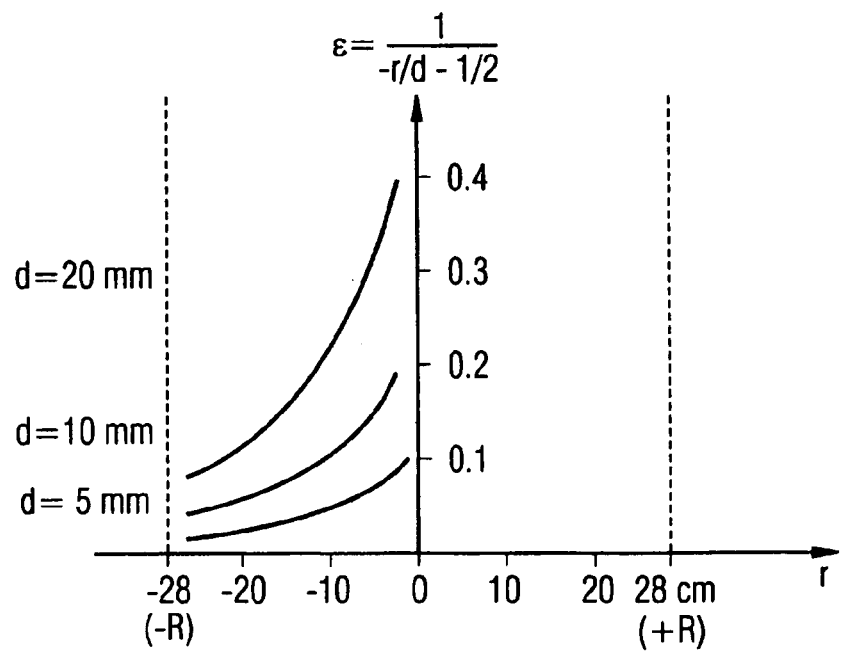

MAGNETIC RESONANCE TOMOGRAPHY METHOD AND APPARATUS WITH SUPPRESSION OF AMBIGUITY ARTIFACTS IN SPIN ECHO IMAGES

BACKGROUND OF THE INVENTION

1. Field of the Invention

The present invention relates in general to magnetic resonance tomography (MRT) as used in the medical field for the examination of patients. This invention relates in particular to a process for avoiding peripheral interference signals in spin-echo images such as e.g. the ambiguity artifact.

2. Description of the Prior Art

MRT is based on the physical phenomenon of nuclear spin resonance and has been successfully implemented in the medical field and in biophysics for more than 15 years. In this examination method, the object is exposed to a strong, constant magnetic field. The nuclear spins of the atoms in the object, which were previously randomly oriented, are thereby aligned. Radio-frequency energy can now excite these "ordered" spins to a specific oscillation. This oscillation creates in MRT the actual measurement signal, which is detected by means of suitable receiving coils. By the use of non-homogeneous magnetic fields, created by gradient coils, the measurement object in each area of interest—also called FOV (field of view)—can be encoded in all three spatial directions, which in general is called "spatial encoding."

The recording of the data in MRT occurs in k-space (frequency domain). The MRT image in the image domain is linked with the MRT data in k-space by Fourier transformation. The spatial encoding of the object, which spans k-space, takes place by means of the gradients in all three spatial directions. In this process a differentiation is made between the slice selection (determines the exposure slice in the object, normally the z axis), the frequency encoding (determines a direction in the slice, normally the x axis), and the phase encoding (determines the second dimension within the slice, normally the y axis).

Thus, a slice e.g. in the z direction is first selectively excited by a slice selection gradient $G_s$ or $G_z$. The encoding of the location information in the slice takes place by combined phase and frequency encoding by means of both of the previously mentioned orthogonal gradient fields $G_r$ and $G_p$, which are created in the example of a slice excited in the z direction by the aforementioned gradient coils in the x and y directions.

One known form for recording the data in an MRT measurement (scan) is shown in FIGS. 2A and 2B. The sequence used is a spin-echo sequence. In this sequence, the magnetization of the spins is flipped in the x-y plane by a 90° excitation impulse (with defined amplitude and bandwidth). Over time, the result is a dephasing of the magnetization components, which together form the transverse magnetization in the x-y plane $M_{xy}$. After a certain period of time (e.g. ½ $T_E$, $T_E$ is the echo time), a 180° pulse (also with defined amplitude and bandwidth) is emitted in the x-y plane so that the dephased magnetization components are mirrored without changing the precession direction and precession speed of the individual magnetization components. After another period of time (½ $T_E$), the magnetization components point in the same direction again, i.e. the result is a regeneration of the transverse magnetization, called "rephasing," which is appropriately read-out. The complete regeneration of the transverse magnetization is called the spin-echo.

In order to measure an entire slice of the object to be examined, the imaging sequence is repeated N times with different values of the phase-encoding gradient $G_P$ or $G_y$, whereby the frequency of the magnetic resonance signal (spin-echo signal) is scanned, digitized, and stored with each sequence repetition by the $\Delta t$-clocked ADC (analog digital converter) N times in equidistant time increments $\Delta t$ in the presence of the selection gradients $G_R$ or $G_X$. In this manner, a numerical matrix is created line by line as per FIG. 2b (matrix in k-space or k matrix) with N×N data points (a symmetrical matrix with N×N points is only one example; asymmetrical matrices also can be created). An MR image of the observed slice with a resolution of N×N pixels can be reconstructed directly from this data record via a Fourier transformation.

The scanning of the k matrix (k matrices when recording several slices) for spin-echo sequences with diagnostically usable image quality typically requires several minutes of measurement time, which represents a problem for many clinical applications. For example, patients might not be able to remain immobile for the required period of time. For examinations in the thorax or the pelvic area, body movement is generally unavoidable (heart and breathing movement, peristalsis). One way to accelerate spin-echo sequences was published in 1986 as the turbo-spin-echo sequence (TSE sequence) also known by the acronym RARE (Rapid Acquisition with Relaxation Enhancement) (J. Hennig et al. Magn. Reson, Med. 3, 823–833, 1986). In this imaging procedure, which is much faster compared to the conventional aforementioned spin-echo procedure, several (multiple) echoes are created after a 90° excitation pulse, and each of these echoes is individually phase-encoded. A pulse sequence is shown in FIG. 3A for the case when seven echoes are created. The phase-encoding gradient corresponding to the Fourier line to be selected must be switched before and after each echo. In this manner, a linear scanning of the k matrix as shown in FIG. 3B takes place after a single RF excitation pulse (90°). The necessary total measurement time is shortened in this example by a factor of 7. The signal progression in FIG. 3a is shown in an idealized manner. In reality, the later echoes have increasingly smaller amplitudes due to the T2 decay of the transverse magnetization.

An even faster imaging sequence is a combination of RARE with the Half-Fourier technique, which was introduced in 1994 as the so-called HASTE sequence (Half Fourier Acquired Single Shot Turbo Spin Echo) (B. Kiefer et al., J. Magn. Reson. Imaging, 4(P), 86, 1994). HASTE uses the same basic technique as RARE, but only half of the k matrix is scanned. The other half of the k matrix is reconstructed mathematically by means of the Half-Fourier algorithm. This takes advantage of the fact that the data points of the k matrix are arranged mirror-symmetrical to the center point of the k matrix. For this reason, it is sufficient to measure only the data points of a k-matrix half and to mathematically complete the raw data matrix by mirroring with respect to the center point (and complex conjugation). In this manner, the measurement time can be reduced by half. The reduction of the recording time, however, degrades the signal-to-noise ratio (SNR) by a factor of $\sqrt{2}$.

A general problem with spin-echo sequences (SE sequences) is that the resonance condition during the radio-frequency excitation by the RF pulse is determined not only in the FOV (field of view, characterized by homogeneity of the basic field as well as linearity of the gradient fields) but also in the non-homogeneous border area of the FOV. Due to the actual inhomogeneity of the basic field and the nonlinearity of the gradient fields in the border area of the MRT device, the principle of a unique reversible assignment of each spatial point to one specific magnetic field strength is violated. This means that a generally interfering image from the inhomogeneity area in the form of an artifact superimposes the image of actual measurement field. This unwanted artifact is known as a "double-entendre artifact" and occurs in a pronounced form in particular in spin-echo sequences as a result of the spin refocusing. The "double-entendre artifact" becomes the more pronounced the shorter the extent of the basic field magnet in the z-direction. Thus, future MRT systems will tend toward shorter magnets, intensify this problem, and it will no longer be solvable with the previous measures for suppressing this artifact.

Prior strategies for reducing this type of artifact are hardware measures and pulse-sequence modifications.

Hardware measures for the RF system include determining the spatial positions with field double entendres outside the useful volume for the given magnet and gradient design. The design of the RF coils is subject to the restriction of sufficiently minimizing its sensitivity for these critical spatial positions so that a significant artifact formation is prevented. RF field distributions, however, are not always able to be appropriately designed. As an unwanted side effect, RF field inhomogeneities that impair the image quality are also created within the useful volume.

The main focuses for the design of future MR devices are shorter magnets, spaciousness, and the largest possible patient accessibility (e.g. for surgical intervention). With this type of magnetic field geometry, the necessary reversible unique correspondence between space and field are violated such that the previous hardware measures fail. For shorter magnets with a large diameter, a suitable RF coil design thus is not possible.

Pulse sequence modifications (new approaches to sequence formation) often represent the only practical solution if the direct avoidance of the drawback (here the non-monotonous magnetic field progression) reaches theoretical or technological limits or requires disproportionately high effort, which would compromise the economic efficiency of the product.

A possible form of the pulse sequence modification according to U.S. Pat. No. 6,486,668 is to bring about an artifact suppression by emitting additional so-called preparation pulses. A disadvantage of this approach is the clear reduction in the time efficiency as well as the simultaneous creation of other image quality problems in the form of parasite spin-echo signal components due to the preparation pulses.

Another form of pulse sequence modification is implemented in U.S. Patent Application Publication No. 2002/0101237, wherein artifact suppression takes place by switching the polarity switch of the selection gradients between the RF excitation pulse and the RF refocusing pulse. In contrast to conventional slice excitation of an SE sequence, the slice selection gradient, which is switched during the slice excitation by the (90°-) RF pulse, compared to the slice selection gradient, which is switched during the (180°-) refocusing pulse, is inverted as to its algebraic sign or its polarity. This causes selection of the (90°-) RF pulse as well as the (180°-) refocusing pulse to occur in the spatial domain in different non-overlapping areas. In this manner, no interfering echo signals are created. This procedure, however, has the disadvantage that it places increased technical demands on the exact temporal synchronization of RF pulses and gradient pulses as well as on the system shimming. Moreover, the simultaneous representation of different chemical components (e.g. fat and water) is only possible with a notable signal loss.

SUMMARY OF THE INVENTION

An object of the present invention is to provide an imaging procedure or, within the framework of spin-echo sequences, to perform a pulse-sequence modification, such that peripheral interference signals (e.g. ambiguity artifacts) are suppressed with simultaneously maximally wide applicability and minimally occurring disadvantageous and thus undesired side effects.

This object is achieved in accordance with the invention by a method for avoiding peripheral interference signals in magnetic resonance tomography when using spin-echo sequences including radio-frequency excitation pulses, radio-frequency refocusing pulses, slice-selection gradient pulses, phase-encoding gradient pulses, and readout gradient pulses, wherein the average frequency and the bandwidth of the radio-frequency excitation pulses differ from the average frequency and the bandwidth of the radio-frequency refocusing pulse(s) and wherein the amplitude of the slice selection gradient activated during the radio-frequency pulses, differ from the amplitude of the slice selection gradient(s) activated during the radio-frequency refocusing pulse(s), such that the excitation slice of the RF refocusing pulse and the refocusing slice of the RF refocusing pulse(s) overlap in the homogeneous volume (FOV) of the basic magnetic field, while the excitation slice of the RF excitation pulse and the refocusing slice of the RF refocusing pulse in the non-homogeneous volume of the basic magnetic field are localized, thereby preventing an echo signal arising in the non-homogeneous volume.

In a first embodiment of the method according to the invention, the average frequency, the bandwidth, and the amplitude of the RF excitation pulses, as well as the amplitude of the slice selection gradients activated during the RF excitation pulse, are increased and the duration of the slice selection gradients switched during the RF excitation pulse is simultaneously avoided compared to the duration of the slice selection gradients activated during the RF refocusing pulse.

In a second embodiment of the method according to the invention, the total duration of the RF pulses as well as the slice selection gradient pulses is maintained and the average frequency, the bandwidth, and the amplitude of the RF excitation pulse as well as the amplitude of the slice selection gradient activated during the RF excitation pulse, are increased compared to the amplitude of the slice selection gradient activated during the RF refocusing pulse.

The unchanged total duration of the RF excitation pulse is used advantageously for improving the slice profile of the excited layer, by other side lobes of the RF excitation pulse being added.

In the case of a transverse slice selection (Gs=Gz) as well as in the case of a sagittal or coronal slice selection (Gs≠Gz), the minimum difference of the slice selection gradient amplitudes can be calculated in the form of a difference factor.

The difference of the amplitude g1 of the layer-selection gradient activated during the RF excitation pulse compared to the amplitude g2 of the slice selection gradient activated during the RF refocusing pulse can be formulated mathematically in accordance with the relationship $g_2=(1+\epsilon)g_1$.

In the case of a transverse slice selection, the difference factor $\epsilon$ can be calculated according to the inequality $$\varepsilon > \frac{1}{(R-r)/d - 1/2}$$

wherein R represents the radius of the FOV, r the slice position of the slice excited in the FOV, and d the slice thickness of the transversal slice excited in the FOV.

In the case of a sagittal or coronal slice selection, the difference factor $\epsilon$ is calculated according to the inequality $$\varepsilon > \frac{1}{-r/d - 1/2}$$

wherein r represents the slice position of the slice excited in the FOV and d the slice thickness of the sagittal or coronal slice excited in the FOV.

The above object is achieved by a magnetic resonance tomography apparatus having a gradient amplifier and gradient coils, an input/display terminal, a sequence controller, and a device processor as well as an analog digital converter (ADC), which is suitable for performing the method as described above.

DESCRIPTION OF THE DRAWINGS

FIG. 1 is a schematic block diagram of a magnetic resonance tomography apparatus constructed and operating in accordance with the invention.

FIG. 4A schematically illustrates the temporal progression of the RF pulses as well as the gradient pulses of a first modified SE sequence in accordance with the invention.

FIG. 4b schematically illustrates the temporal progression of the RF pulses as well as the gradient pulses of a second modified SE sequence in accordance with the invention.

FIG. 5A schematically illustrates the magnetic field situation in the z direction for transverse slice selection with identical selection gradient strengths (left) as well as low but sufficiently different selection gradient strengths (right).

FIG. 5B shows overlapped images of a multi-layer scan for a transverse slice in accordance with the situation of FIG. 5A containing ambiguity artifacts (left image) and in accordance with the situation of FIG. 5 in which the ambiguity artifacts are suppressed in accordance with the invention (right image).

FIG. 6A schematically illustrates the magnetic field situation in the z direction for sagittal or coronal slice selection with identical selection gradient strengths (left) as well as low but sufficiently different selection gradient strengths (right).

FIG. 6B shows overlapped images of a multi-layer scan for a sagittal or coronal slice containing ambiguity artifacts and in accordance with the situation of FIG. 6A (left image), and in which the ambiguity artifacts are suppressed in accordance with the invention (right image).

FIG. 8A schematically illustrates a simplified field model of the basic field magnet for sagittal or coronal slice selection (left) as well as taking into consideration FIG. 8B shows a set of curves of the parameter $\epsilon$ depending on the distance from the center of the FOV for different slice thicknesses for sagittal or coronal slice selection.

DESCRIPTION OF THE PREFERRED EMBODIMENTS

Figure 2A:
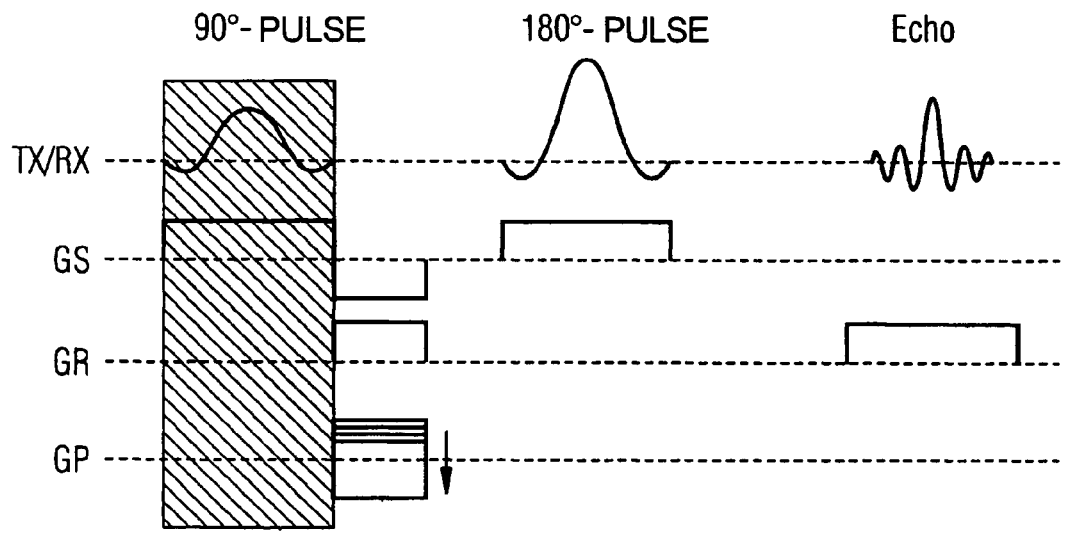
FIG. 2A schematically illustrates the temporal progression of the gradient pulses in a known spin-echo sequence.
Figure 2B:
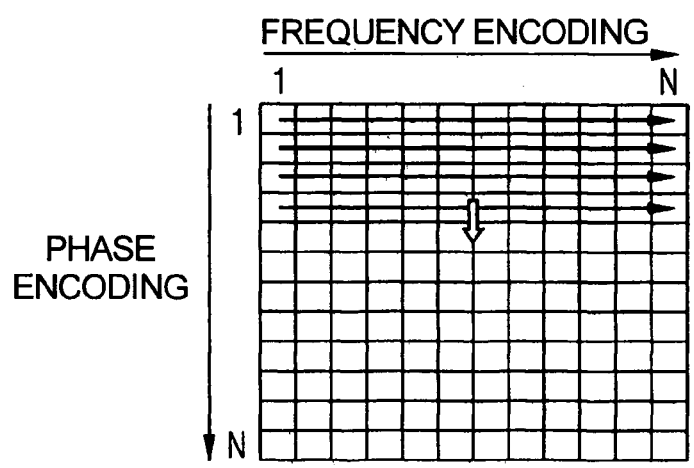
FIG. 2B schematically illustrates the temporal scanning of the k matrix by a spin-echo sequence in accordance with FIG. 2A.
Figure 3A:
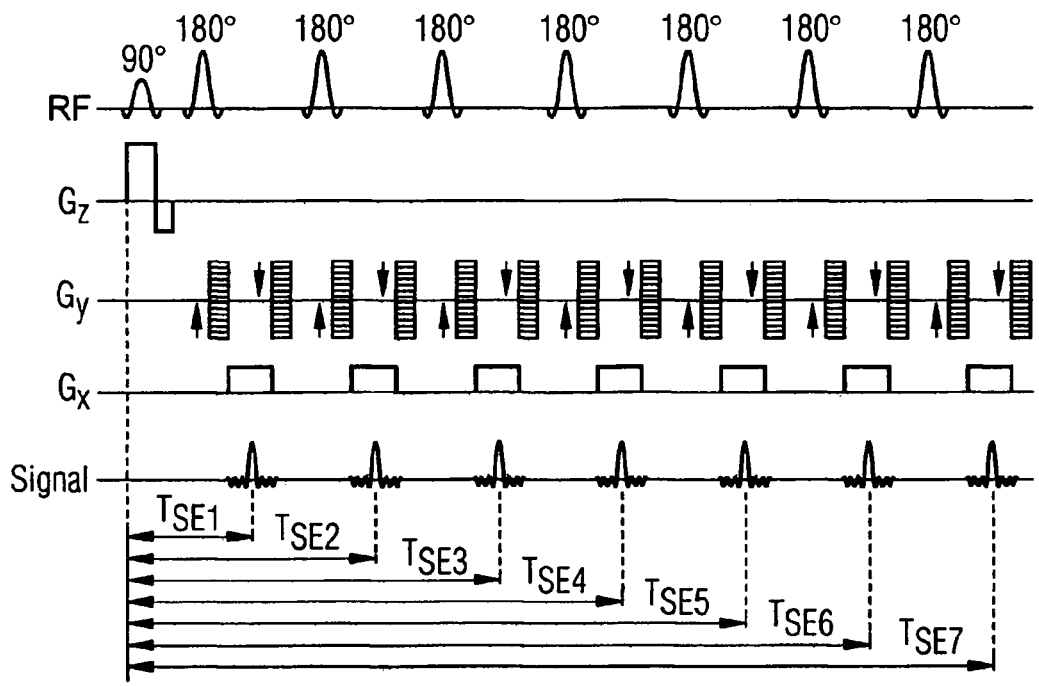
FIG. 3A schematically illustrates the temporal progression of the gradient pulses in a known turbo-spin-echo sequence (TSE or RARE sequence) in which seven spin echoes are generated.
Figure 3B:
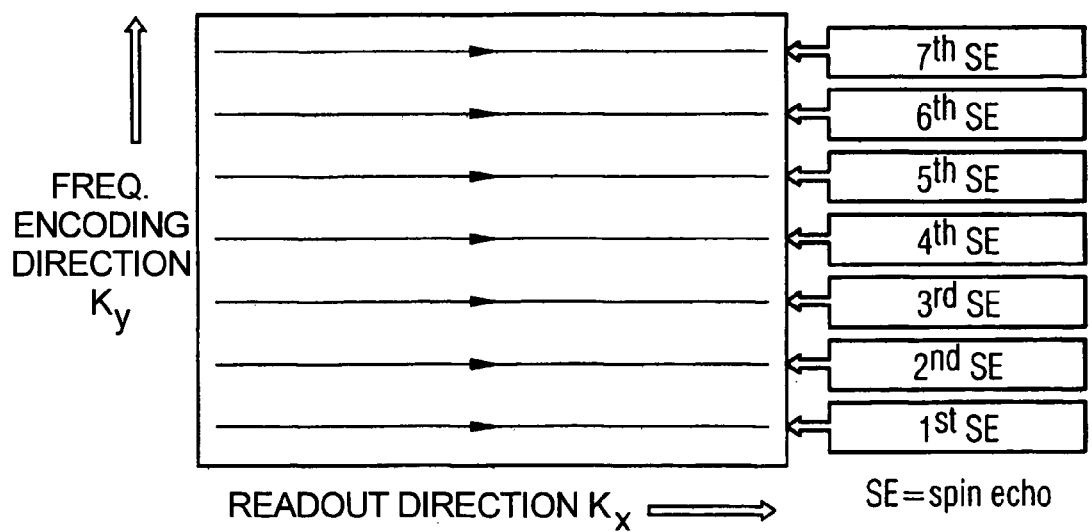
FIG. 3B schematically illustrates the temporal scanning of the k matrix for a TSE or RARE sequence in accordance with FIG. 3A.

FIG. 1 is a block diagram of a magnetic resonance tomography apparatus for generating gradient pulses in accordance with the invention. The basic components of the tomography apparatus correspond to those of a conventional tomography, with the exceptions and differences discussed below. A basic field magnet 1 creates a temporally constant, strong basic magnetic field for the polarization or orientation of the nuclear spin in the examination volume of an object, e.g. a body part to be examined of a human subject. The high homogeneity required for obtaining magnetic resonance data is defined in a spherical imaging volume M, into which the body part or parts to be examined are placed. To support the homogeneity requirements and in particular to eliminate temporally invariable factors, shim plates of ferromagnetic material are attached at suitable locations. Temporally variable factors are eliminated by shim coils 2, which are driven by a shim power supply 15.

A cylindrical gradient coil system 3 is disposed in the basic field magnet 1 that includes three windings. The windings are supplied with power from respective amplifiers 14 for the creation of a linear gradient field in the respective directions of the Cartesian coordinate system. The first winding of the gradient coil system 3 creates a gradient Gx in the x direction, the second winding creates a gradient Gy in the y-direction, and the third winding creates a gradient Gz in the z direction. Each amplifier 14 has a digital-to-analog converter, which is driven by a sequence controller 18 for the correctly timed creation of the gradient pulses.

Within the gradient coil system 3 is a radio-frequency antenna 4 that converts the radio-frequency pulses generated by a radio-frequency power amplifier 30 into an alternating field for exciting the nuclei and orienting the nuclear spins of the object to be examined or the volume to be examined. The alternating field emitted from the nuclear spins, generally the echo signals generated by a pulse sequence from one or more radio-frequency pulses and one or more gradient pulses, is converted by the antenna 3 into a voltage that is fed to a radio-frequency reception channel 8 of a radio-frequency system 22 via an amplifier 7. The radio-frequency unit 22 further has a transmission channel 9, in which the radio-frequency pulses for the excitation of the magnetic resonance signals are created. According to a pulse sequence provided by a control computer 20 or a sequence controller 18, the radio-frequency pulses are represented digitally as a sequence of complex numbers. This sequence of numbers is fed as real and imaginary parts to respective inputs 12 of a digital-to-analog converter in the radio-frequency unit 22, and from this to the transmission channel 9. In the transmission channel 9, the pulse sequences are modulated with a radio-frequency carrier signal, the base frequency of which corresponds to the resonance frequency of the nuclear spin.

Switch between reception and transmission modes takes place via a diplexer switch 6. The radio-frequency antenna 4 emits the radio-frequency pulses for exciting the nuclear spins into the imaging volume M and detects the resulting echo signals. The thus-obtained magnetic resonance signals are demodulated in the reception channel 8 of the radio-frequency system 22 in a phase-sensitive manner and are converted via an analog-to-digital converter into a real part and an imaginary part of the measurement signal. An image is reconstructed by an image computer 17 from the measurement data obtained in this manner. The management of the measurement data, the image data, and the control programs takes place in the control computer 20. From an input defining a measurement protocol, the sequence controller 18 controls the creation of each desired pulse sequence and the corresponding scanning of k space in accordance with appropriate control programs. In particular, the sequence controller 18 controls the correct timing of the switching of the gradients, the emission of the radio-frequency pulses with defined phase and amplitude as well as the reception of the magnetic resonance signals. The time bases for the radio-frequency unit 22 and the sequence controller 18 are made available by a synthesizer 19. The selection of the corresponding control programs for the creation of a magnetic resonance image as well as the representation of the image takes place via a terminal 21, which has a keyboard as well as one or more monitors.

The present invention involves the creation of a new type of RF excitation for spin echo sequences. This is the largest treatment need since the majority of all imaging processes are based on this sequence type and the ambiguity artifact simultaneously occurs in pronounced form as a result of the spin refocusing. The invention concerns measures that ensure a highly effective artifact suppression with only marginal sequence modification. The sequence progression in accordance with the invention is generated in the sequence controller 18 or in the control computer 20. The image reconstruction takes place in the control computer 20 or in the image computer 17.

In general, the basic concept of the invention is as follows. At least two slice selection processes are required to create spin echoes. Contrary to common practice, the slice selection processes are not designed the same but instead intentionally different with respect to selection gradient strengths and RF pulse bandwidth, with the goal of spatially separating the unwanted volume that is selected in outside the FOV (also called the "useful volume). The selection within the FOV occurs by suitable selection of the average frequencies ω1, ω2 as well as the bandwidths Δω1, Δω2 of the RF excitation pulse and the RF refocusing pulse, respectively, at the same location (same slice) and to enable, as previously, the acquisition of the desired echo signal from this slice. By the spatial separation of the unwanted selected volume arising due to (parasitic excitations) outside of the FOV (based on the selection of ω1, Ω2, Δω1, Δω2 as well as the different amplitudes g1 and g2 of the slice selection gradients GS1 during the RF excitation pulse and the layer-selection gradients GS2 during the RF refocusing pulse, FIGS. 5A and 6A), the formation of an echo signal in the non-homogeneous area is prevented and the ambiguity artifact in the images is suppressed. Preferably, the RF spin excitation is changed at the start of the sequence ("90° pulse") so that the selection gradient strength and RF pulse bandwidth are increased insignificantly (20% to 30%).

The dissimilarity is thereby selected to be a small as possible in order to ensure the wider application as well as the minimization of unwanted side effects. Such side effects are primarily the chemical shift and SAR aspects (specific absorption rate):

As a result of the 3 to 4 ppm chemical fat/water shift, the slice positions are always different for fat and water. For each of the two chemical components, the excitation profile and all refocusing profiles are congruent only when the selection gradient strengths do not change. Strictly speaking, this no longer applies for the sequence design described below, but the signal loss of different chemical components as a result of the selection profiles being compresses against each other is limited to a few percent and thus is irrelevant.

With increasing slice or projection thickness (slab imaging), the complete separation of the unwanted volumes selected in error outside the useful volume requires correspondingly larger differences in the selection gradient strengths and RF pulse bandwidths. The usable range for the RF bandwidths is limited on one side (upper limit) by the available RF performance and SAR consideration and on the other side (lower limit) by a decreasing time performance of the sequence, e.g. echo and repetition time. With a dissimilarity of, for example, 100% (that is still eminently practical), the layer or projection thicknesses can be set up to about 100 mm with the sequence modification in accordance with the invention without appreciable artifact formation.

The invention is explained below with two exemplary embodiments (FIGS. 4A and 4B):

The upper part of the sequence diagrams in each of FIGS. 4A and 4B shows a conventional SE sequence. In the uppermost line, a beginning excitation pulse α (RF excitation pulse, α is normally 90°) is shown in the transmission mode TX with an average frequency ω and a bandwidth Δω, while a positive slice selection gradient GS1 is activated at the same time. After the RF excitation pulse, the slice selection gradient is inverted. In the meantime, the selection gradient GR is activated and a phase encoding is implemented by the phase-encoding gradients GP. This is followed by a refocusing by a 180° refocusing pulse at the same time as a second slice excitation by the slice selection gradients GS2. In the conventional SE sequence, both slice selection gradients GS1 and GS2 have the same amplitude. In order to able to acquire an MR echo signal after the echo time TE by activating a readout gradient GR in the subsequent reception mode RX of the MRT apparatus, it is necessary to select the average frequency as well as the bandwidth of the 180° refocusing pulse to be the same as the average frequency ω and the bandwidth Δω of the RF excitation pulse. These circumstances will be described in greater detail later using additional figures.

The sequence in accordance with the invention is a modified spin-echo sequence (SE sequence). The modification includes changing the parameters of the RF excitation pulse (α pulse), the RF refocusing pulse (180° pulse), and the slice selection gradient (GS) such that a slice still is excited within the FOV and a spin echo is acquired from this slice, but the parasitic excitations arising from both RF pulses outside the FOV are separated locally and thus do not lead to a spin-echo signal.

In one embodiment of the invention (FIG. 4A), the variation of the parameters, for example, takes place by the amplitudes, the average frequencies as well as the bandwidths of both RF pulses being varied. At the same time, the duration as well as the amplitude of the slice selection gradients GS1 and GS2 are changed correspondingly. In accordance with FIG. 4A, the α pulse is compressed temporally; and its amplitude is increased. It has the average frequency ω1 and the bandwidth Δω1. The 180° pulse has the average frequency ω2 and the bandwidth Δω2. The first slice selection gradient GS1 is shortened, its amplitude g1 is increased with respect to amplitude g2 of the second slice selection gradients GS2.

In a second embodiment of the invention (FIG. 4B), the variation of the parameters occurs by the total duration of the α pulse and the first slice selection gradient GS1 remaining the same, with the pulse amplitude g1 being increased relative to the amplitude g2 of GS2. The α pulse is compressed, but the original pulse duration remains by further side lobes of the sinc-function of the excitation pulse being added with the advantageous side effect of an improved slice profile. This has only a minimal effect on the SAR value, since the unchanged refocusing pulses dominate. The average frequencies ω1 and ω2 as well as the bandwidths Δω1 and Δω2 are varied correspondingly and are adjusted for each other correspondingly.

The FIGS. 5A and 6A (left image in each) show the undesired or parasitic layer excitation inside or outside of the FOV with a conventional spin-echo sequence. Due to the human body form and the conventional patient positioning, field ambiguities occur primarily in the longitudinal body position (z direction). This necessitates a differentiation, dependent on whether the slice selection takes places with the z-gradient (transverse slices) or without the z-gradient (sagittal and coronal slices). FIG. 5A represents the transverse slice selection (Gs=Gz) and FIG. 6A the sagittal or coronal slice selection (Gs≠Gz).

With a transverse slice excitation (FIG. 5A), the slice selection gradient GS (=GZ) in the field of the FOV first proceeds linearly. The connected steep field drop is due to the inhomogeneity of the basic field as well as due to the non-linearity of the gradient field causes the parasitic excitations.

With a sagittal or coronal slice excitation (FIG. 6A), there is no slice selection gradient in the z direction. Nevertheless, parasitic excitations occur due to the steep drop of the basic magnetic field outside the FOV.

Overall, this leads to the phenomenon that, for scans with a conventional 2D spin echo sequence, ambiguity artifacts occur for transverse slice orientation and for sagittal or coronal slice orientation at different places in the images. These circumstances are shown in FIG. 5B and 6B wherein total images from multi-layer scans with conventional 2D spin echoes are displayed superimposed. FIG. 5B (left) shows ambiguity artifacts in the transverse slice orientation, FIG. 6B (left) shows ambiguity artifacts in sagittal or coronal slice orientation. The different occurrence of the artifacts in the images depending on each slice position becomes visible if the different field situations during the signal creation and the signal detection are permitted to enter into consideration. The last-mentioned aspect affects the position of the artifacts in the images and should not be worsened in further imaging, since the considerations in accordance with the invention only affect the layer-selection process.

As shown above (description for FIGS. 4A and 4B), the slice selection takes place with non-identical selection gradient strengths, i.e. at least with a first gradient strength g1 and a second gradient strength g2:

$$g_2 = (1+\epsilon)g_1 \quad (1)$$

Conventional spin-echo sequences use $\epsilon=0$. The case $\epsilon=-2$ corresponds to the aforementioned sequence modification of art known sequence involving polarity switching of the selection gradients). In accordance with the invention, advantageous sequence properties in the selection of $\epsilon>0$ are discussed below.

The average frequency ω and the bandwidth Δω of the RF pulses for excitation and refocusing of a certain slice naturally must affect the same local area that is defined by the desired slice position r and slice thickness d, i.e.

$$\omega_1 = \gamma g_1 r \quad (2a)$$

$$\omega_2 = \gamma g_2 r = (1+\epsilon)\omega_1 \quad (2b)$$

$$\Delta\omega_1 = \gamma g_1 d \quad (3a)$$

$$\Delta\omega_2 = \gamma g_2 d = (1+\epsilon)\Delta\omega_1 \quad (3b)$$

FIG. 5A compares the case of conventional transverse slice excitation (left image) with the case of transverse slice selection for different selection gradient strengths for excitation and refocusing (right image). The right image shows slightly but sufficiently different selection gradient strengths ($g_2=(1+\epsilon)g_1$) without ambiguity artifact formation.

FIG. 5B shows the effectiveness of this type of sequence modification based on the configurations in FIG. 5A using the example of a 2D spin-echo scan. Already with moderately different slice selections ($\epsilon=0.2$ through 0.3), the artifacts in this situation are very effectively suppressed (FIG. 5B right).

FIG. 6A compares the case of conventional sagittal or coronal slice excitation (left image) with the case of sagittal or coronal slice selection for different RF pulses for excitation and refocusing (α pulse or refocusing pulse, right image). The right image shows slightly but sufficiently different RF pulses ($\omega_2=(1+\epsilon)\omega_1$) without ambiguity artifact formation.

FIG. 6B shows the effectiveness of this type of sequence modification based on the configurations in FIG. 6A also using the example of a 2D spin-echo scan. Already with slightly different slice selections ($\epsilon=0.2$ through 0.3), the artifacts are effectively suppressed (FIG. 6B right).

The adequate selection of decisive parameter ε is discussed in greater detail below using a simple mathematical model of the spatial field distributions.

Figure 7A:
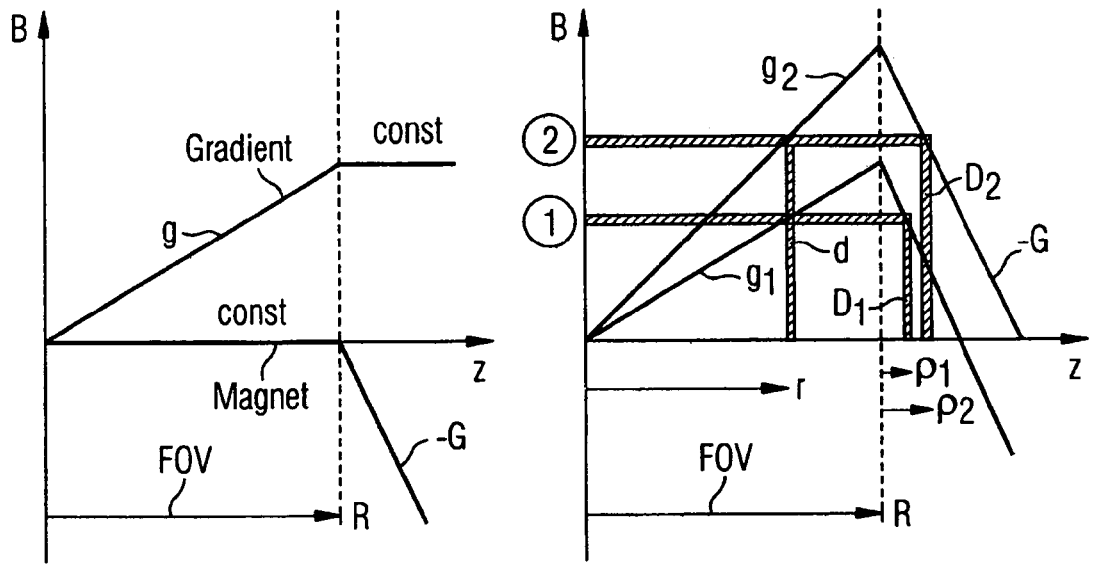
FIG. 7A schematically illustrates a simplified field model for the transverse slice selection for two slightly but sufficiently different slice selection gradients according to the invention (left: magnetic and gradient field separated, right: total field).

FIG. 7A shows a field model for the transverse slice selection. In the case of the left image in FIG. 7A—an idealization of the real case—the field of the z-gradient increases to the edge R of the FOV proportionally to the z-coordinate and then continues at a constant rate, while the basic field is initially constant and then drops outside the FOV (>R) with consistent field gradients —G. The right image in FIG. 7A shows the curve of the total field according to the invention with different selection gradient strengths g1 and g2. In both cases, the desired layer (position r, thickness d) is selected, whereas the parasitic areas outside the useful volume are different (positions p1 and p2 with thicknesses D1 and D2).

The idealized model in accordance with FIG. 7A simplifies the actual situation to the effect that the field distribution is ideally accepted within the FOV with radius R (homogenous basic field and linear gradient field). In the outer area >R, the gradient field no longer increases and the field drop of the basic field should take place with constant field gradients —G.

The following applies for both selection processes (FIG. 7A, right image) with the gradient strengths g1 and g2:

$$\omega_1 = \gamma g_1 r = \gamma g_1 R - \gamma G \rho_1 \tag{4a}$$

$$\omega_2 = \gamma g_2 r = \gamma g_2 R - \gamma G \rho_2 \tag{4b}$$

$$\Delta\omega_1 = \gamma g_1 d = \gamma G D_1 \tag{5a}$$

$$\Delta\omega_2 = \gamma g_2 d = \gamma G D_2 \tag{5b}$$

The parasitic selections at the locations ρ1 and ρ2 are displaced against each other by:

$$\rho_2 - \rho_1 = (R - r)(g_2 - g_1)/G \tag{6}$$

The goal is complete ambiguity artifact suppression, i.e. the complete separation of this volume, selected but not wanted, with the thicknesses D1 and D2:

$$\rho_2 - \rho_1 > (D_1 + D_2)/2 \tag{7}$$

This results as the expression for the parameter ε through the use of equations (1) through (6) into the inequality (7):

$$\varepsilon > \frac{1}{(R-r)/d - 1/2} \tag{8}$$

for values of r with $$r < R - d/2 \tag{9}$$

Figure 7B:
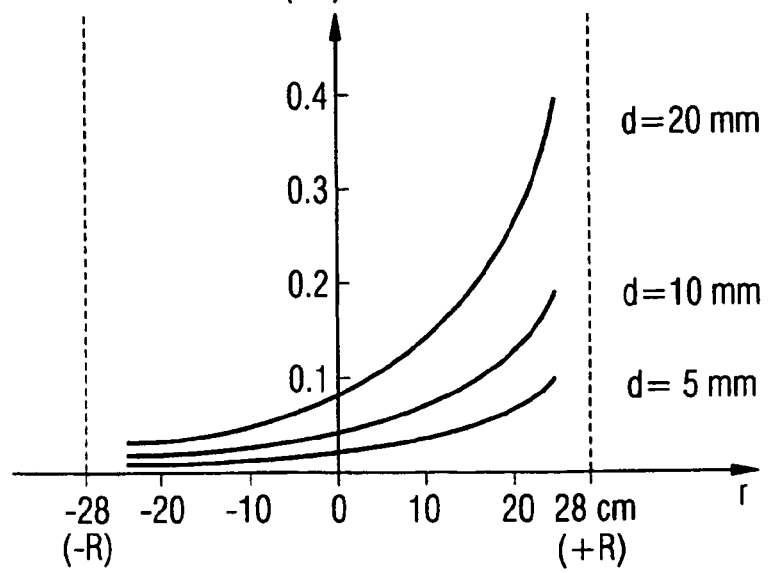
FIG. 7B shows a set of curves of the parameter $\epsilon$ depending on the distance from the center of the FOV for different layer thicknesses for transverse slice selection.

It should be noted that the expression (8) depends only on the distance (R−r) between the slice and the edge of the FOV, measured in units of the slice thickness d. The bigger the distance the smaller the demand on ε, which can be seen in FIG. 7B using the hyperbolic functions shown in FIG. 7B. FIG. 7B shows the progression of the ε values with a transverse slice selection. If the parameter ε exceeds the represented minimum value, then the artifact is completely suppressed according to the field model used in FIG. 7A. 2D spin-echo scans with a conventional slice thickness fulfill this condition with ε=0.2 to 0.3.

The pole spot on the edge of the FOV corresponds to the disappearance of the ambiguity at this location (target slice and unwanted selection merge here).

The absence of a dependency on g1, g2, and G are also worth noting, i.e. the absolute magnitude of the gradient strength and the RF pulse bandwidth as well as the field drop of the basic field in the outer area do not play a role and can be arbitrarily selected.

For completeness, modeling is also shown for sagittal or coronal slice orientations. FIG. 8A shows the field model concerning this orientation. In the left image of FIG. 8A, the basic field is initially constant and then drops outside of the FOV (>R) with consistent field gradient —G. The right image of FIG. 8A shows how, besides the desired slice (this cannot be shown here due to x or y dependency), the different parasitic areas are selected outside of the FOV (positions ρ1 and ρ2 with thicknesses D1 and D2).

Since the shown measures concern the slice selection procedure exclusively and the z-gradient is not involved, the assumptions concerning this gradient do not apply. The field progression of the basic field is once again assumed to be constant within the useful volume and, in the outside area >R, is described by the constant field gradient —G.

The following then applies for both selection processes with the gradient strengths g1 and g2:

$$\omega_1 = \gamma g_1 r = \gamma G \rho_1 \tag{10a}$$

$$\omega_2 = \gamma g_2 r = \gamma G \rho_1 \tag{10b}$$

$$\Delta\omega_1 = \gamma g_1 d = \gamma G D_1 \tag{11a}$$

$$\Delta\omega_2 = \gamma g_2 d = \gamma G D_2 \tag{11b}$$

The parasitic selections at the locations ρ1 and ρ2 are displaced against each other by:

$$\rho_2 - \rho_1 = -r(g - g_1)/G \tag{12}$$

The goal, as before, is the complete ambiguity artifact suppression, i.e. the complete separation of this volume, selected but unwanted, with the thicknesses D1 and D2:

$$\rho_2 - \rho_1 > (D_1 + D_2)/2 \tag{13}$$

This results as condition for the parameter ε through the use of equations (10a) through (12) into the inequality (13):

$$\varepsilon > \frac{1}{-r/d - 1/2} \tag{14}$$

for values of r with $$r < -d/2 \tag{15}$$

In this case, the parameter ε depends on the distance r between the slice and the center of the basic field, measured in units of the slice thickness d. The larger this distance the smaller the requirement of ε. FIG. 8B shows the hyperbolic functions for sagittal or coronal slice selection: if the parameter ε exceeds the represented minimum value, then the ambiguity artifact is completely suppressed according to the field model in accordance with FIG. 8A. 2D spin-echo procedures with a conventional slice thicknesses fulfill this condition with ε=0.2 to 0.3. The pole in the center of the basic field corresponds to the disappearance of the ambiguity at this location (target slice and unwanted selection merge here).

The limits of this sequence-method artifact suppression are described below.

The poles in the ε diagrams (FIGS. 7B and 8b) are not just a phenomenon of this simple mathematical model. As already shown, they describe a real occurrence, the transition from an ambiguity artifact to a geometrical distortion. This occurs when the desired slice and the parasitically selected volume lie close together along the field reversal points and finally merge. A separation is naturally impossible with overlapping or identity, which leads to the poles in the mathematical modeling.

Artifacts thus are not completely avoidable in this boundary situation, instead the appearance differs significantly from a typical ambiguity artifact and is more similar to an image distortion. The assignment of the artifact structure to a real object is recognizable and does not eliminate the danger of misinterpretations.

Another aspect that the employed field model does not express due to its simplifications concerns the real spatial field distributions outside of the FOV. The constant field progression of the z-gradient in the outside area >R assumed for transversal slice selection does not apply at least for large distances >>R. In fact, the gradient field will fall again on its own (i.e. without consideration of the basic field) and have a field ambiguity.

This condition, however, is not yet disadvantageous. At the same time, the decay of the basic field must also be assumed not to appear in the outside area >R.

Thus, an artifact risk is created only where the basic field has no field deviations at the same time. Instead of the hitherto one-dimensional field curve, the complete spatial field distribution of the magnet must be examined and taken into consideration. Only this type of coincidence together with a sufficiently high RF sensitivity of the Ref antenna to this location contains the risk of the ambiguity artifact being not completely suppressed with the inventive sequence modification.

If necessary, this aspect can be taken into account during the design of the RF antenna represents a minor and accomplishable auxiliary condition in contrast to the limitation with conventional spin-echo sequences.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for avoiding peripheral interference signals when using a spin-echo pulse sequence for magnetic resonance tomography, comprising the steps of:

placing a subject in a basic magnetic field having a homogenous volume adjoining a non-homogeneous volume;

obtaining echo signals from the subject in said basic magnetic field using a spin-echo pulse sequence, including emitting a radio-frequency excitation pulse and, during said radio-frequency excitation pulse, activating a first slice selection gradient, and emitting a radio-frequency refocusing pulse and, during said radio-frequency refocusing pulse, activating a second slice selection gradient; and in said spin-echo sequence, employing a radio-frequency excitation pulse having an average frequency and a bandwidth that differ from an average frequency and a bandwidth of said radio-frequency refocusing pulse, and activating said first slice selection gradient with an amplitude $g_1$ differing from an amplitude $g_2$ of said second slice selection gradient $g_2=(1+\epsilon)g_1$, for superimposing a transverse excitation slice in the subject produced by said radio-frequency excitation pulse in said homogenous volume, and a refocusing slice in the subject produced by said radio-frequency refocusing pulse in said homogenous volume, and locally separating, from said homogenous volume, a portion of said refocusing slice produced by said radio-frequency refocusing pulse in said non-homogenous volume for substantially preventing echo signals from arising in said non-homogenous volume, wherein $$\varepsilon > \frac{1}{(R-r)/d - 1/2},$$

wherein R is the radius of the homogenous volume, r is a slice position of said transverse layer, and d is a thickness of said transverse excitation slice.

2. A method as claimed in claim 1 comprising increasing the average frequency and the bandwidth and an amplitude of said radio-frequency excitation pulse, as well as the amplitude of said first slice selection gradient, and simultaneously and correspondingly decreasing a duration of said first slice selection gradient with respect to a duration of said second slice selection gradient.

3. A method as claimed in claim 1 comprising, without altering a total duration of said radio-frequency excitation pulse, said radio-frequency refocusing pulse, said first slice selection gradient and said second slice selection gradient, increasing the average frequency, the bandwidth and an amplitude of said radio-frequency excitation pulse, as well as the amplitude of said first slice selection gradient, compared to the amplitude of said second slice selection gradient.

4. A method as claimed in claim 3 comprising adding side lobes to said radio-frequency excitation pulse.

5. A method, for avoiding peripheral interference signals when using a spin-echo pulse sequence for magnetic resonance tomography, comprising the steps of:

placing a subject in a basic magnetic field having a homogenous volume adjoining a non-homogeneous volume;

obtaining echo signals from the subject in said basic magnetic field using a spin-echo pulse sequence, including emitting a radio-frequency excitation pulse and, during said radio-frequency excitation pulse, activating a first slice selection gradient, and emitting a radio-frequency refocusing pulse and, during said radio-frequency refocusing pulse, activating a second slice selection gradient; and in said spin-echo sequence, employing a radio-frequency excitation pulse having an average frequency and a bandwidth that differ from an average frequency and a bandwidth of said radio-frequency refocusing pulse, and activating said first slice selection gradient with an amplitude $g_1$ differing from an amplitude $g_2$ of said second slice selection gradient $g_2=(1+\epsilon)g_1$, for superimposing a sagittal excitation slice in the subject produced by said radio-frequency excitation pulse in said homogenous volume, and a refocusing slice in the subject produced by said radio-frequency refocusing pulse in said homogenous volume, and locally separating, from said homogenous volume, a portion of said refocusing slice produced by said radio-frequency refocusing pulse in said non-homogenous volume for substantially preventing echo signals from arising in said non-homogenous volume, wherein $$\varepsilon > \frac{1}{-r/d - 1/2},$$

wherein r is a slice position of said coronal layer, and d is a thickness of said sagittal excitation slice.

6. A method as claimed in claim 5 comprising increasing the average frequency and the bandwidth and an amplitude of said radio-frequency excitation pulse, as well as the amplitude of said first slice selection gradient, and simultaneously and correspondingly decreasing a duration of said first slice selection gradient with respect to a duration of said second slice selection gradient.

7. A method as claimed in claim 5 comprising, without altering a total duration of said radio-frequency excitation pulse, said radio-frequency refocusing pulse, said first slice selection gradient and said second slice selection gradient, increasing the average frequency, the bandwidth and an amplitude of said radio-frequency excitation pulse, as well as the amplitude of said first slice selection gradient, compared to the amplitude of said second slice selection gradient.

8. A method as claimed in claim 7 comprising adding side lobes to said radio-frequency excitation pulse.

9. A method for avoiding peripheral interference signals when using a spin-echo pulse sequence for magnetic resonance tomography, comprising the steps of:
placing a subject in a basic magnetic field having a homogenous volume adjoining a non-homogeneous volume;
obtaining echo signals from the subject in said basic magnetic field using a spin-echo pulse sequence, including emitting a radio-frequency excitation pulse and, during said radio-frequency excitation pulse, activating a first slice selection gradient, and emitting a radio-frequency refocusing pulse and, during said radio-frequency refocusing pulse, activating a second slice selection gradient; and
in said spin-echo sequence, employing a radio-frequency excitation pulse having an average frequency and a bandwidth that differ from an average frequency and a bandwidth of said radio-frequency refocusing pulse, and activating said first slice selection gradient with an amplitude $g_1$ differing from an amplitude $g_2$ of said second slice selection gradient $g_2=(1-\epsilon)g_1$, for superimposing a coronal excitation slice in the subject produced by said radio-frequency excitation pulse in said homogenous volume, and a refocusing slice in the subject produced by said radio-frequency refocusing pulse in said homogenous volume, and locally separating, from said homogenous volume, a portion of said refocusing slice produced by said radio-frequency refocusing pulse in said non-homogenous volume for substantially preventing echo signals from arising in said non-homogenous volume, wherein $$\varepsilon > \frac{1}{-r/d - 1/2},$$

wherein r is a slice position of said coronal layer, and d is a thickness of said coronal excitation slice.

10. A method as claimed in claim 9 comprising increasing the average frequency and the bandwidth and an amplitude of said radio-frequency excitation pulse, as well as the amplitude of said first slice selection gradient, and simultaneously and correspondingly decreasing a duration of said first slice selection gradient with respect to a duration of said second slice selection gradient.

11. A method as claimed in claim 9 comprising, without altering a total duration of said radio-frequency excitation pulse, said radio-frequency refocusing pulse, said first slice selection gradient and said second slice selection gradient, increasing the average frequency, the bandwidth and an amplitude of said radio-frequency excitation pulse, as well as the amplitude of said first slice selection gradient, compared to the amplitude of said second slice selection gradient.

12. A method as claimed in claim 11 comprising adding side lobes to said radio-frequency excitation pulse.

13. A magnetic resonance tomography apparatus for avoiding peripheral interference signals when using a spin-echo pulse sequence for magnetic resonance tomography, comprising:
a magnetic resonance scanner having a basic field magnet for generating a basic magnetic field having a homogenous volume and a non-homogeneous volume and adapted to receive a subject therein, a radio-frequency antenna for generating radio-frequency pulses, and a gradient coil system for generating magnetic gradients;
a system control for operating said radio-frequency antenna and said gradient coil system for obtaining echo signals from the subject in said basic magnetic field using a spin-echo pulse sequence, including emitting a radio-frequency excitation pulse and, during said radio-frequency excitation pulse, activating a first slice selection gradient, and emitting a radio-frequency refocusing pulse and, during said radio-frequency refocusing pulse, activating a second slice selection gradient; and
said system control, in said spin-echo sequence, setting an average frequency and a bandwidth for said radio-frequency excitation pulse that differ from an average frequency and a bandwidth of said radio-frequency refocusing pulse, and activating said first slice selection gradient with an amplitude $g_1$ differing from an amplitude $g_2$ of said second slice selection gradient, with $g_2=(1+\epsilon)g_1$ for superimposing a transverse excitation slice in the subject produced by said radio-frequency excitation pulse in said homogenous volume, and a refocusing slice in the subject produced by said radio-frequency refocusing pulse in said homogenous volume, and locally separating, from said homogenous volume, a portion of said refocusing slice produced by said radio-frequency refocusing pulse in said non-homogenous volume for substantially preventing echo signals from arising in said non-homogenous volume, wherein $$\varepsilon > \frac{1}{(R-r)/d - 1/2}$$

wherein R is the radius of the homogenous volume, r is a slice position of said transverse layer, and d is a thickness of said transverse excitation slice.

14. A magnetic resonance tomography apparatus as claimed in claim 13 wherein said control system increases the average frequency and the bandwidth and an amplitude of said radio-frequency excitation pulse, as well as the amplitude of said first slice selection gradient, and simultaneously and correspondingly decreases a duration of said first slice selection gradient with respect to a duration of said second slice selection gradient.

15. A magnetic resonance tomography apparatus as claimed in claim 13 wherein said control system, without altering a total duration of said radio-frequency excitation pulse, said radio-frequency refocusing pulse, said first slice selection gradient and said second slice selection gradient, increases the average frequency, the bandwidth and an amplitude of said radio-frequency excitation pulse, as well as the amplitude of said first slice selection gradient, compared to the amplitude of said second slice selection gradient.

16. A magnetic resonance tomography apparatus as claimed in claim 15 wherein said control system adds side lobes to said radio-frequency excitation pulse.

17. A magnetic resonance tomography apparatus for avoiding peripheral interference signals when using a spin-echo pulse sequence for magnetic resonance tomography, comprising:

a magnetic resonance scanner having a basic field magnet for generating a basic magnetic field having a homogenous volume and a non-homogeneous volume and adapted to receive a subject therein, a radio-frequency antenna for generating radio-frequency pulses, and a gradient coil system for generating magnetic gradients;

a system control for operating said radio-frequency antenna and said gradient coil system for obtaining echo signals from the subject in said basic magnetic field using a spin-echo pulse sequence, including emitting a radio-frequency excitation pulse and, during said radio-frequency excitation pulse, activating a first slice selection gradient, and emitting a radio-frequency refocusing pulse and, during said radio-frequency refocusing pulse, activating a second slice selection gradient; and said system control, in said spin-echo sequence, setting an average frequency and a bandwidth for said radio-frequency excitation pulse that differ from an average frequency and a bandwidth of said radio-frequency refocusing pulse, and activating said first slice selection gradient with an amplitude $g_1$ differing from an amplitude $g_2$ of said second slice selection gradient, with $g_2=(1+\epsilon)g_1$ for superimposing a sagittal excitation slice in the subject produced by said radio-frequency excitation pulse in said homogenous volume, and a refocusing slice in the subject produced by said radio-frequency refocusing pulse in said homogenous volume, and locally separating, from said homogenous volume, a portion of said refocusing slice produced by said radio-frequency refocusing pulse in said non-homogenous volume for substantially preventing echo signals from arising in said non-homogenous volume, wherein $$\varepsilon > \frac{1}{-r/d - 1/2}$$

wherein r is a slice position of said sagittal layer, and d is a thickness of said sagittal excitation slice.

18. A magnetic resonance tomography apparatus as claimed in claim 17 wherein said control system increases the average frequency and the bandwidth and an amplitude of said radio-frequency excitation pulse, as well as the amplitude of said first slice selection gradient, and simultaneously and correspondingly decreases a duration of said first slice selection gradient with respect to a duration of said second slice selection gradient.

19. A magnetic resonance tomography apparatus as claimed in claim 17 wherein said control system, without altering a total duration of said radio-frequency excitation pulse, said radio-frequency refocusing pulse, said first slice selection gradient and said second slice selection gradient, increases the average frequency, the bandwidth and an amplitude of said radio-frequency excitation pulse, as well as the amplitude of said first slice selection gradient, compared to the amplitude of said second slice selection gradient.

20. A magnetic resonance tomography apparatus as claimed in claim 19 wherein said control system adds side lobes to said radio-frequency excitation pulse.

21. A magnetic resonance tomography apparatus for avoiding peripheral interference signals when using a spin-echo pulse sequence for magnetic resonance tomography, comprising:

a magnetic resonance scanner having a basic field magnet for generating a basic magnetic field having a homogenous volume and a non-homogeneous volume and adapted to receive a subject therein, a radio-frequency antenna for generating radio-frequency pulses, and a gradient coil system for generating magnetic gradients;

a system control for operating said radio-frequency antenna and said gradient coil system for obtaining echo signals from the subject in said basic magnetic field using a spin-echo pulse sequence, including emitting a radio-frequency excitation pulse and, during said radio-frequency excitation pulse, activating a first slice selection gradient, and emitting a radio-frequency refocusing pulse and, during said radio-frequency refocusing pulse, activating a second slice selection gradient; and said system control, in said spin-echo sequence, setting an average frequency and a bandwidth for said radio-frequency excitation pulse that differ from an average frequency and a bandwidth of said radio-frequency refocusing pulse, and activating said first slice selection gradient with an amplitude $g_1$ differing from an amplitude $g_2$ of said second slice selection gradient, with $g_2=(1+\epsilon)g_1$ for superimposing a coronal excitation slice in the subject produced by said radio-frequency excitation pulse in said homogenous volume, and a refocusing slice in the subject produced by said radio-frequency refocusing pulse in said homogenous volume, and locally separating, from said homogenous volume, a portion of said refocusing slice produced by said radio-frequency refocusing pulse in said non-homogenous volume for substantially preventing echo signals from arising in said non-homogenous volume, wherein $$\varepsilon > \frac{1}{-r/d - 1/2}$$

wherein r is a slice position of said coronal layer, and d is a thickness of said coronal excitation slice.

22. A magnetic resonance tomography apparatus as claimed in claim 21 wherein said control system increases the average frequency and the bandwidth and an amplitude of said radio-frequency excitation pulse, as well as the amplitude of said first slice selection gradient, and simultaneously and correspondingly decreases a duration of said first slice selection gradient with respect to a duration of said second slice selection gradient.

23. A magnetic resonance tomography apparatus as claimed in claim 21 wherein said control system, without altering a total duration of said radio-frequency excitation pulse, said radio-frequency refocusing pulse, said first slice selection gradient and said second slice selection gradient, increases the average frequency, the bandwidth and an amplitude of said radio-frequency excitation pulse, as well as the amplitude of said first slice selection gradient, compared to the amplitude of said second slice selection gradient.

24. A magnetic resonance tomography apparatus as claimed in claim 23 wherein said control system adds side lobes to said radio-frequency excitation pulse.

* * * * *